United States Patent
Moon et al.

(10) Patent No.: US 6,773,946 B2
(45) Date of Patent: Aug. 10, 2004

(54) METHOD FOR FABRICATING LIGHT-EMITTING DIODE USING NANOSIZE NITRIDE SEMICONDUCTOR MULTIPLE QUANTUM WELLS

(75) Inventors: Yong Tae Moon, Kwangju (KR); Nae Man Park, Kwangju (KR); Baek Hyun Kim, Kwangju (KR); Seong Ju Park, Kwangju (KR)

(73) Assignee: Kwagju Institute of Science and Technology, Kwangju (KR)

( * ) Notice: Subject to any disclaimer, the term of this patent is extended or adjusted under 35 U.S.C. 154(b) by 0 days.

(21) Appl. No.: 10/330,336

(22) Filed: Dec. 30, 2002

(65) Prior Publication Data

US 2004/0094756 A1 May 20, 2004

(30) Foreign Application Priority Data

Nov. 15, 2002 (KR) ................................. 10-2002-0071081

(51) Int. Cl.$^7$ ............................................. H01L 21/00
(52) U.S. Cl. ............................................ 438/34; 438/47
(58) Field of Search ............................. 257/14; 438/29, 438/34, 35, 46, 47, 481, 482

(56) References Cited

U.S. PATENT DOCUMENTS 6,544,870 B2 * 4/2003 Park et al. .................. 438/507
6,657,232 B2 * 12/2003 Morkoc ....................... 257/76

OTHER PUBLICATIONS

Moon et al, "Growth of self–assembled nanosize InGaN/GaN multiple quantum wells embedded in amorphouse SiN$_x$ by metalorganic vapor phase epitaxy", Journal of Crystal Growth, 248 (2003) 494–497, 2002.

* cited by examiner

Primary Examiner—Sara Crane
(74) Attorney, Agent, or Firm—Nixon & Vanderhye P.C.

(57) ABSTRACT

Disclosed is a nanosized III-nitride compound semiconductor multiple quantum well light-emitting diode, comprising a silicon substrate (100), and an amorphous silicon nitride layer (base) (200) formed on the substrate and including III-nitride compound semiconductor nano grains (230) spontaneously formed therein. The nanosized nitride semiconductor multiple quantum well light-emitting diode and the fabrication method thereof according to the present invention are free from the problems of the conventional III-nitride compound semiconductor epitaxial thin film growth on silicon substrates. Accordingly, a high-quality nanosized III-nitride compound semiconductor multiple quantum well light-emitting diode having no crystalline defect can be provided. Furthermore, the nanosized multiple quantum well light-emitting diode according to the present invention does not require a p-type GaN thin film so that there is no possibility of causing crack that is a problem in the conventional method of fabricating a III-nitride compound semiconductor light-emitting diode using III-nitride epitaxial thin films grown on silicon substrates. In addition, the number of processes of fabricating the diode is remarkably reduced to result in an economical and productive light-emitting diode fabrication process.

4 Claims, 7 Drawing Sheets

METHOD FOR FABRICATING LIGHT-EMITTING DIODE USING NANOSIZE NITRIDE SEMICONDUCTOR MULTIPLE QUANTUM WELLS

BACKGROUND OF THE INVENTION

1. Field of the Invention

The present invention relates to a III-nitride compound semiconductor ($Al_xIn_yGa_{1-x-y}N$, $0 \leq x,y \leq 1$) nanosized multiple quantum well light-emitting diode and a fabrication method thereof, and more particularly, to a III-nitride compound semiconductor nanosized multiple quantum well light-emitting diode having an amorphous silicon nitride ($SiN_x$) layer (base) 200 including III-nitride compound semiconductor nanocrystals 230 spontaneously formed and a fabrication method thereof.

2. Background of the Related Art

An optical device or an electronic device based on III-nitride compound semiconductors ($Al_xIn_yGa_{1-x-y}N$, $0 \leq x, y \leq 1$) is fabricated in such a manner that a high-quality gallium nitride (GaN) thin film is basically grown on a sapphire substrate. The problem in this fabrication method is that sapphire that is expensive, hard and insulated is used as the substrate. Accordingly, the development of a substrate capable of replacing sapphire is required. The most typical substitute substrate is a silicon substrate. Studies on the silicon substrate are being widely carried out because the silicon substrate is cheap and conductive and it has an advantage in that a well-advanced electronic device based on silicon and an optical device based on gallium nitride (GaN) can be integrated with each other on the silicon substrate.

FIG. 1 is a schematic cross-sectional view of a conventional nitride semiconductor multiple quantum well light-emitting diode.

As shown in FIG. 1, the conventional nitride semiconductor multiple quantum well light-emitting diode is fabricated in such a manner that an n-type GaN 11 is deposited on a silicon substrate 10, a multiple quantum well composed of an InGaN 13 and a GaN 14 is formed on the n-type GaN 11 into an active layer 12, a p-type GaN 15 is formed thereon, and negative and positive metal electrodes 16 and 17 are formed on the n-type GaN and the p-type GaN, respectively. That is, the diode includes an n-type GaN layer, an active layer and a p-type GaN thin film as basic constituent elements.

However, the growth of the GaN thin film on the silicon substrate 10 has the following problems.

Firstly, silicon crystal and GaN crystal have a relatively large lattice mismatch of about 17% therebetween and a big difference in thermal expansion coefficient of 37% there between. These seriously deteriorate the quality of the GaN thin film formed on the silicon substrate.

Secondly, the growth of the GaN thin film having high quality on the silicon substrate is needed to integrate a silicon based electronic device and a GaN based optical device. However, the silicon substrate has a cubic crystalline structure and the GaN grown by a general technique has a hexagonal crystalline structure so that it is basically difficult to grow the high-quality GaN thin film on the silicon substrate due to a difference in crystalline structure.

Thirdly, an amorphous silicon nitride layer is spontaneously formed on the surface of the silicon substrate due to an undesired chemical reaction when the GaN thin film is grown on the silicon substrate, which makes it difficult to grow a high-quality GaN thin film.

Fourthly, in order to form the p-type GaN thin film having a high hole concentration, a technique for growing the high-quality GaN thin film is needed and the grown thin film should be thermally treated at a high temperature. This post-thermal treatment at a high-temperature for activating such a p-type dopant causes serious cracks on the thin film due to a large difference in thermal expansion coefficient between the GaN thin film and the silicon substrate.

SUMMARY OF THE INVENTION

An object of the present invention is to provide a high-quality nitride semiconductor nanosized multiple quantum well light-emitting diode having no crystalline defect and a fabrication method thereof.

Another object of the present invention is to provide a nitride semiconductor nanosized multiple quantum well light-emitting diode requiring no p-type GaN thin film and a fabrication method thereof.

To accomplish the objects of the present invention, there is provided a nitride semiconductor nanosized multiple quantum well light-emitting diode comprising: a silicon substrate 100; and an amorphous silicon nitride layer (base) 200 formed on the substrate 100 and including III-nitride compound semiconductor nano grains 230 spontaneously formed therein.

To accomplish the objects of the present invention, there is also provided a method of fabricating a nanosized multiple quantum well light-emitting diode using a III-nitride compound semiconductor, comprising the steps of: growing an amorphous silicon nitride ($SiN_x$) layer on a silicon substrate; growing III-nitride compound semiconductor nanostructures on the amorphous silicon nitride layer; and growing an amorphous silicon nitride cover layer on the amorphous silicon nitride layer and the nitride semiconductor nanostructures grown on the amorphous silicon nitride layer.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE INVENTION

A III-nitride compound semiconductor nanosized multiple quantum well light-emitting diode and a fabrication method thereof according to the present invention will be described in detail hereinafter.

Distinguished from the conventional method of growing the GaN thin film on the silicon substrate 100, the present invention is based on a new method of embedding nanosized nitride semiconductor multiple quantum well nanograins in an amorphous silicon nitride matrix, that is, spontaneously forming nitride semiconductor nanophases having a nanometer size in an amorphous silicon nitride layer (base) 200 grown on a silicon substrate 100 [J. Crystal Growth 248, 494 (2003)].

The nitride semiconductor nanosized multiple quantum well light-emitting diode according to the present invention includes a silicon substrate 100 and an amorphous silicon nitride layer (base) 200 formed on the substrate 100 and including nitride semiconductor nano grains 230 spontaneously formed therein, the nitride semiconductor nano grains 230 serving as an active layer.

Figure 1:
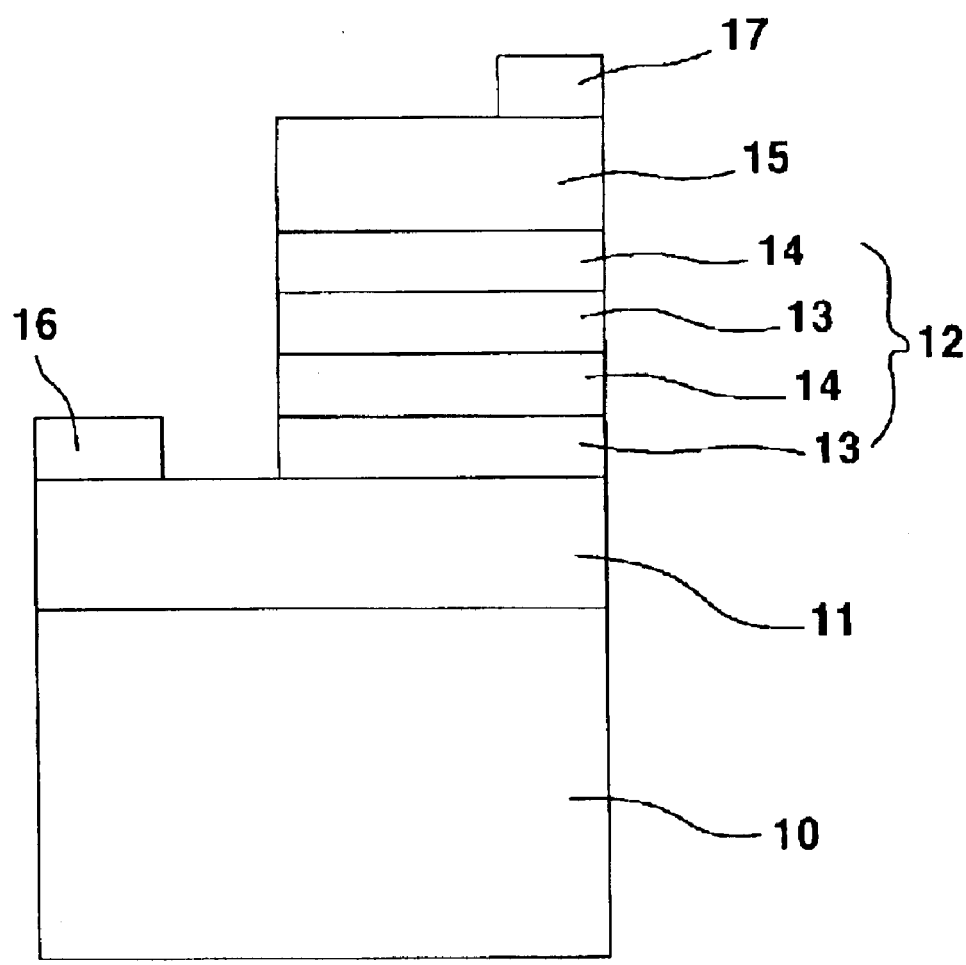
FIG. 1 is a schematic cross-sectional view showing the structure of a conventional nitride semiconductor multiple quantum well light-emitting diode.
Figure 2:
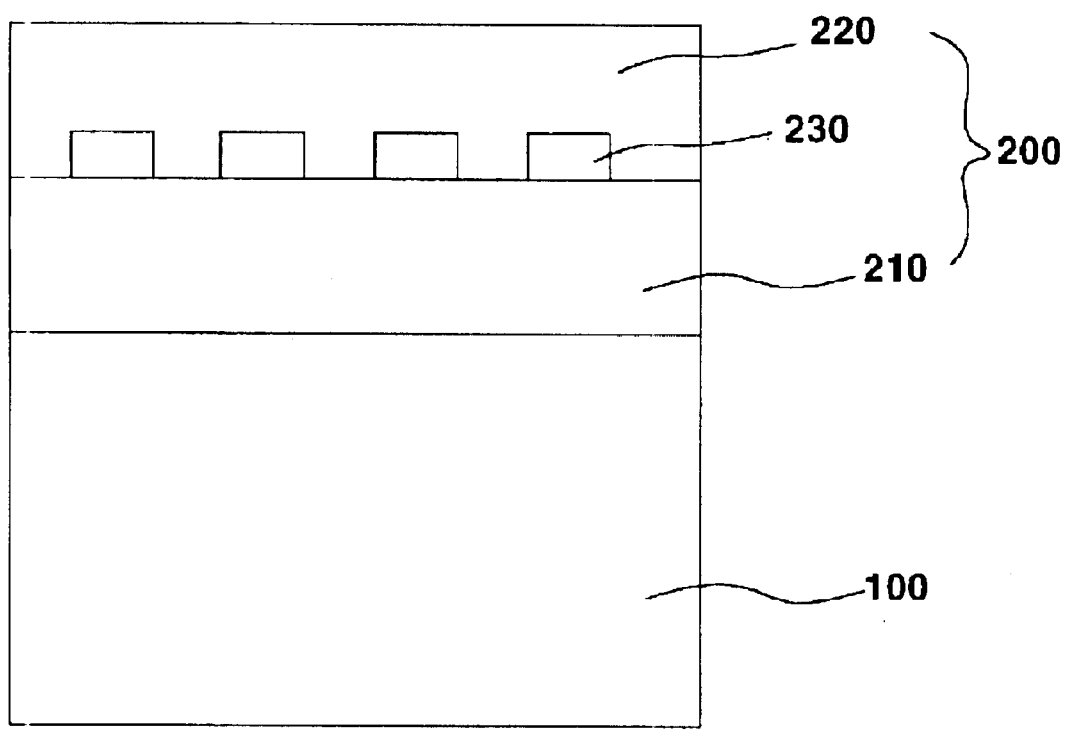
FIG. 2 is a schematic cross-sectional view showing the structure of a nanosized nitride semiconductor multiple quantum well light-emitting diode in which an amorphous silicon nitride layer (base) has nitride semiconductor nano grains formed therein according to the present invention.

FIG. 2 is a schematic cross-sectional view showing the structure of a nitride semiconductor nanosized multiple quantum well light-emitting diode in which an amorphous silicon nitride layer (base) 200 has III-nitride compound semiconductor nano grains 230 formed therein according to the present invention.

As shown in FIG. 2, the amorphous silicon nitride layer (base) 200 of the nitride semiconductor nanosized multiple quantum well light-emitting diode of the invention is preferably composed of an amorphous silicon nitride layer 210, nitride semiconductor nano grains 230 spontaneously formed on the amorphous silicon nitride layer 210, and an amorphous silicon nitride cover layer 220 formed on the amorphous silicon nitride layer 210 and the spontaneously formed nitride semiconductor nano grains 230.

The III-nitride compound semiconductor nano grains 230 are nano particles of $Al_xIn_yGa_{1-x-y}N$ ($0 \leq x, y \leq 1$) or nano particles of $Al_xIn_yGa_{1-x-y}N/Al_iIn_jGa_{1-i-j}N$ ($0 \leq x, y, i, j \leq 1$) forming a multiple quantum well structure. The multiple quantum well structure can be grown on nano grains of $Al_xIn_yGa_{1-x-y}N$ ($0 \leq x, y \leq 1$).

Figure 3:
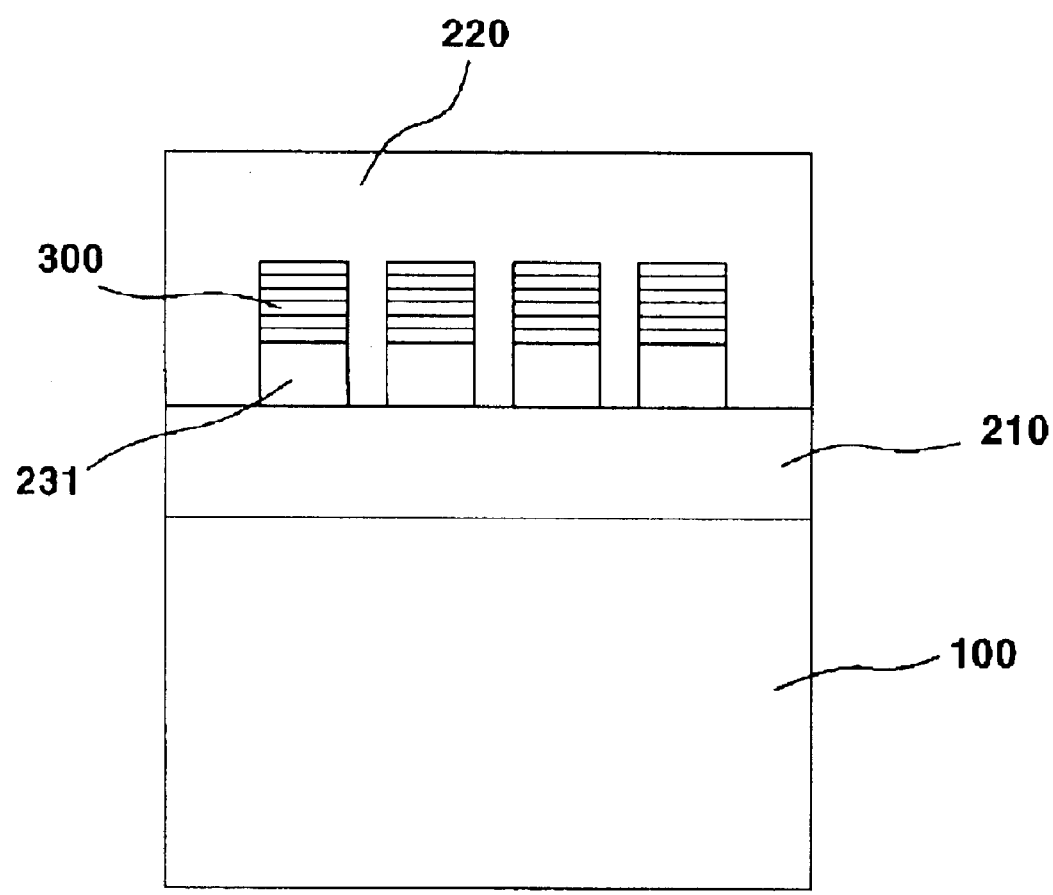
FIG. 3 is a schematic cross-sectional view showing the structure of a nanosized nitride semiconductor multiple quantum well light-emitting diode in which multiple quantum wells are formed on nano grains of $Al_xIn_yGa_{1-x-y}N$ ($0 \leq x,y \leq 1$) according to the present invention.

FIG. 3 is a schematic cross-sectional view showing the structure of a nitride semiconductor nanosized multiple quantum well light-emitting diode in which multiple quantum wells are formed on nano grains of $Al_xIn_yGa_{1-x-y}N$ ($0 \leq x, y \leq 1$) according to the present invention.

Referring to FIG. 3, an amorphous silicon nitride layer 210 is formed on a silicon substrate 100, and nano grains 231 of $Al_xIn_yGa_{1-x-y}N$ ($0 \leq x, y \leq 1$) are spontaneously formed on the amorphous silicon nitride layer 210. In addition, multiple quantum wells 300 are grown on the nano grains and the cover layer 220 is formed on the multiple quantum wells 300 and the amorphous silicon nitride layer 210. Preferably, the diameter of the nano grain of $Al_xIn_yGa_{1-x-y}N$ ($0 \leq x, y \leq 1$) is 1 to 500 nm. In the case where the diameter of the nano grain is larger than 500 nm, it is difficult to completely cover the nano grains with the cover layer and the density of the nano grains is considerably decreased. Furthermore, when the diameter of the nano grain is smaller than 1 nm, the nano grains are not thermodynamically stabilized.

In case of the multiple quantum well structure, it is preferable that the diameter of the nano grain of $Al_xIn_yGa_{1-x-y}N/Al_iIn_jGa_{1-i-j}N$ ($0 \leq x, y, i, j \leq 1$) is 3 to 500 nm such that one to twenty pairs of layers, each layer having the thickness of 1 to 20 nm, are repeatedly laminated.

The multiple quantum well structure can exhibit satisfactory quantum confinement effect when each of the layers constructing the multiple quantum wells has the thickness of 1 to 20 nm or so. Furthermore, when a quantum well having a small energy gap and a quantum barrier having a large energy gap are laminated in multiple layers, carriers are effectively confined in the quantum wells so that optical and electrical performances of the diode can be remarkably improved. When the number of the layers exceeds twenty, a crystal defect is caused to deteriorate the performance of the diode.

More preferably, the nitride semiconductor nanosized multiple quantum well light-emitting diode according to the present invention is fabricated in such a manner that an electron injection layer (not shown) is formed on the amorphous silicon nitride layer (base) 200.

As a preferred example, the amorphous silicon nitride layer (base) 200 including the spontaneously formed nitride semiconductor nano grains of $Al_xIn_yGa_{1-x-y}N$ with a diameter of 1 to 500 nm or multiple quantum well nano grains composed of one to twenty pairs of $Al_xIn_yGa_{1-x-y}N/Al_iIn_jGa_{1-i-j}N$ is formed as an active layer on a p-type silicon substrate 100, and an n-type $Al_xIn_yGa_{1-x-y}N$ ($0 \leq x, y \leq 1$) with a layer thickness of 1 to 500 nm is formed as an electron injection layer (not shown) on the amorphous silicon nitride layer.

The amorphous silicon nitride cover layer 220 has low carrier mobility so that electrons injected through the negative metal electrode cannot be laterally diffused from the cover layer. On the other hand, the electron injection layer (not shown) has high carrier mobility so that injected electrons can be laterally and widely diffused. Thus, the carriers can be uniformly diffused and enter the nano grains that is the active layer, thereby improving the performance of the diode.

Moreover, although it is difficult to inject carriers from the negative metal electrode into the amorphous silicon nitride having a large energy gap, the electron injection layer (not shown) has an energy gap smaller than that of the amorphous silicon nitride so that resistance to the injection of carriers from the metal electrode can be reduced, thereby improving the performance of the device.

A method of fabricating the nitride semiconductor nanosized multiple quantum well light-emitting diode according to the present invention includes a step (S1) growing an amorphous silicon nitride layer 210 on a silicon substrate 100, a step (S2) of growing nitride semiconductor nano grains 230 on the amorphous silicon nitride layer 210, and a step (S3) of growing an amorphous silicon nitride cover layer 220 on the amorphous silicon nitride layer 210 and the nitride semiconductor nano grains 230 grown on the amorphous silicon nitride layer.

Preferably, a p-type, $p^+$-type, n-type or $n^+$-type silicon substrate is used as the substrate 100, and trimethylgallium, trimethylindium, trimethylaluminum and $NH_3$ are respectively used as sources of gallium, indium, aluminum and nitrogen, used for spontaneously forming the nitride semiconductor nano grains 230.

Figure 4:
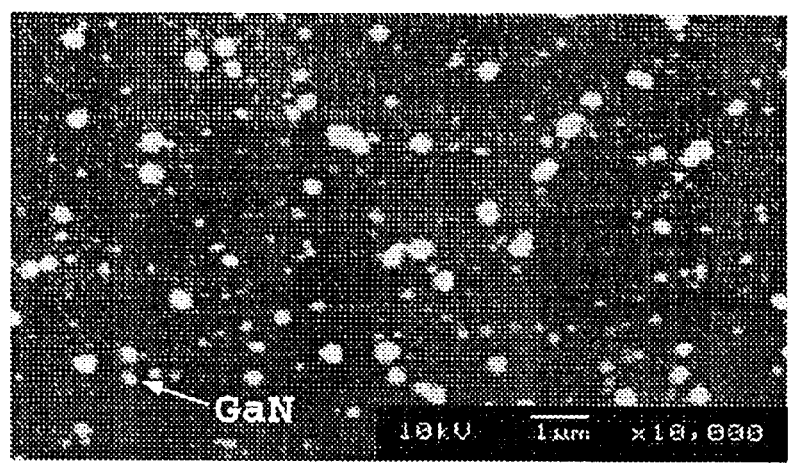
FIG. 4 is a SEM picture of GaN nanocrystals grown on a thermally nitrided p-type silicon substrate according to the present invention.

FIG. 4 is a SEM picture of GaN nano crystals grown at 900° C. on a thermally nitrided p-type silicon substrate according to the present invention.

To carry out the step S1, the silicon substrate 100 is nitrided using ammonia. Nitridation of the silicon substrate 100 using ammonia forms an amorphous silicon nitride thin film on the surface of the silicon substrate.

Preferably, the amorphous silicon nitride layer 210 is formed to have a thickness of 1 to 50 nm at a temperature of 25 to 1100° C. in the step S1.

When the temperature is higher than 1100° C., thermal decomposition rate of the silicon substrate becomes high. When the temperature is lower than 25° C., mobility of atoms is so low that chemical reaction cannot occur. Probability of resonant tunneling of carriers becomes significantly low when the amorphous silicon nitride layer is thicker than 50 nm, and carriers cannot be effectively confined in terms of quantum mechanics when it is thinner than 1 nm.

In the step S2, the amorphous silicon nitride layer 210 formed in the step S1 thermodynamically promotes the formation of the nitride semiconductor nano grains thereon. The nitride semiconductor nano grains having the size of nanometer are spontaneously formed on the amorphous silicon nitride layer 210 using chemical vapor deposition (CVD), molecular beam epitaxy (MBE), sputtering system and the like. Here, hydrogen is used as a carrier gas.

The size and density of the nitride semiconductor nano grains are controlled by the delicate adjustment of growth parameters including growth temperature, growth time, growth gas flow and the like.

The nitride semiconductor nano grains are formed in such a manner that nano grains of $Al_xIn_yGa_{1-x-y}N$ ($0 \leq x,y \leq 1$) are grown on the amorphous silicon nitride layer 210 (S2-1), or the multiple quantum wells 300 of $Al_xIn_yGa_{1-x-y}N/Al_iIn_jGa_{1-i-j}N$ ($0 \leq x,y,i,j \leq 1$) are formed on the amorphous silicon nitride layer (S2-2), or the nano grains of $Al_xIn_yGa_{1-x-y}N$ ($0 \leq x,y \leq 1$) are grown and then the multiple quantum well layers 300 of $Al_xIn_yGa_{1-x-y}N/Al_iIn_jGa_{1-i-j}N$ ($0 \leq x,y,i,j \leq 1$) are formed on the nano grains (S2-3).

Preferably, the nano grains of $Al_xIn_yGa_{1-x-y}N$ ($0 \leq x,y \leq 1$) are grown to have the diameter of 1 to 500 nm at a temperature of 25 to 1100° C. When the temperature is higher than 1100° C., thermal decomposition rate of $Al_xIn_yGa_{1-x-y}N$ becomes high. When the temperature is lower than 25° C., on the other hand, mobility of atoms is so low that chemical reaction cannot occur.

The multiple quantum well layers 300 of $Al_xIn_yGa_{1-x-y}N/Al_iIn_jGa_{1-i-j}N$ ($0 \leq x,y,i,j \leq 1$) are formed in such a manner that one to twenty pairs of layers are repeatedly deposited at a temperature of 500 to 1100° C. When the temperature is higher than 1100° C., nano grains are difficult to form because thermal decomposition rate of $Al_xIn_yGa_{1-x-y}N$ becomes high. When the temperature is lower than 500° C., ammonia decomposition efficiency is low and thermal energy required for chemical reaction is insufficient, thereby failing in obtaining a, high-quality multiple quantum well structure of $Al_xIn_yGa_{1-x-y}N/Al_iIn_jGa_{1-i-j}N$ ($0 \leq x,y,i,j \leq 1$)

In the step S3, the amorphous silicon nitride cover layer 220 is grown on the amorphous silicon nitride layer 210 and the nitride semiconductor nano grains 230 grown on the amorphous silicon nitride layer 210.

The GaN nanograins embedded in the amorphous silicon nitride matrix 200 can be obtained in such a manner that GaN nano grains are formed on the amorphous silicon nitride layer 210, as described above, and then covered with a thin amorphous silicon nitride layer 220. The amorphous silicon nitride cover layer 220 is grown using a chemical vapor deposition system. Preferably, the amorphous silicon nitride cover layer 220 is 1 to 50 nm in thickness.

Furthermore, the GaN nano grains embedded in the amorphous silicon nitride layer (base) 200 may be formed in such a manner that an amorphous Ga—Si—N compound layer composed of gallium atoms, silicon atoms and nitrogen atoms is thermally annealed.

Another method for spontaneously forming the GaN nano grains in the amorphous silicon nitride layer (base) 200 is that a small amount of gallium source gas is added to amorphous silicon nitride being grown by using a silicon source gas and a nitrogen source gas. The GaN nano grains that are spontaneously formed on the growing amorphous silicon nitride layer (base) 200 under the properly controlled growth conditions can be embedded into the continuously growing amorphous silicon nitride layer (base) 200.

As a preferred example, the GaN nano grains are grown on the nitrided p-type silicon substrate 100, and then InGaN nano grains are grown to have the thickness of approximately 4 nm at a growth temperature reduced to 700 to 800° C. on the GaN nanograins. The amorphous silicon nitride cover layer 220 having the thickness of about 20 nm is formed on the InGaN nano grains through a chemical vapor deposition method. The amorphous silicon nitride layer (base) 200 including GaN or InGaN nano grains has a large band gap of approximately 5 eV so that it can exhibit an quantum confinement effect for carriers injected into the nano grains.

The amorphous silicon nitride is more advantageous than silicon oxide as a matrix material of GaN or InGaN nano grains because oxygen atoms act as a fatal impurity harmful to the material characteristics of the nano grains.

Figure 5:
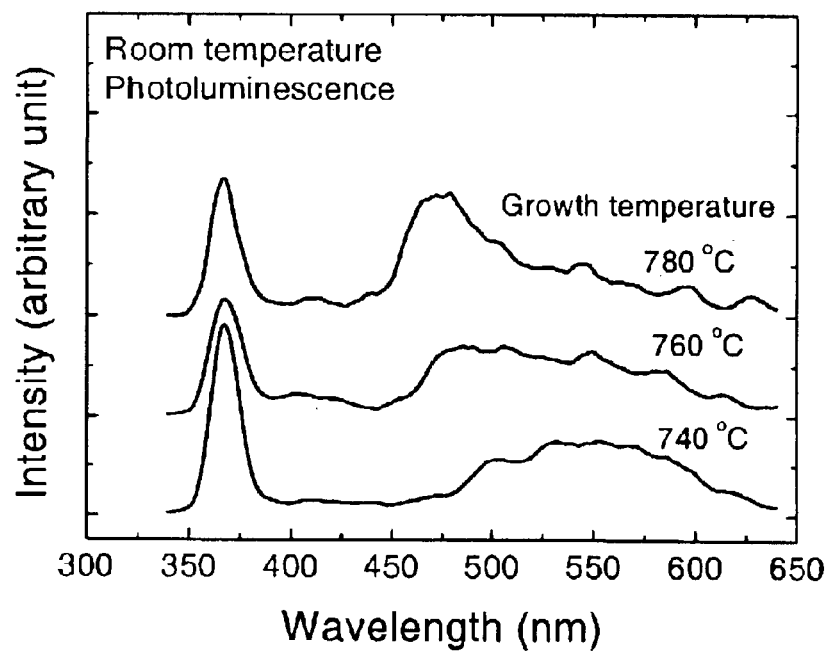
FIG. 5 is a graph showing the room-temperature optical characteristic spectrum of InGaN nanocrystals imbedded in the amorphous silicon nitride according to the present invention.
Figure 6:
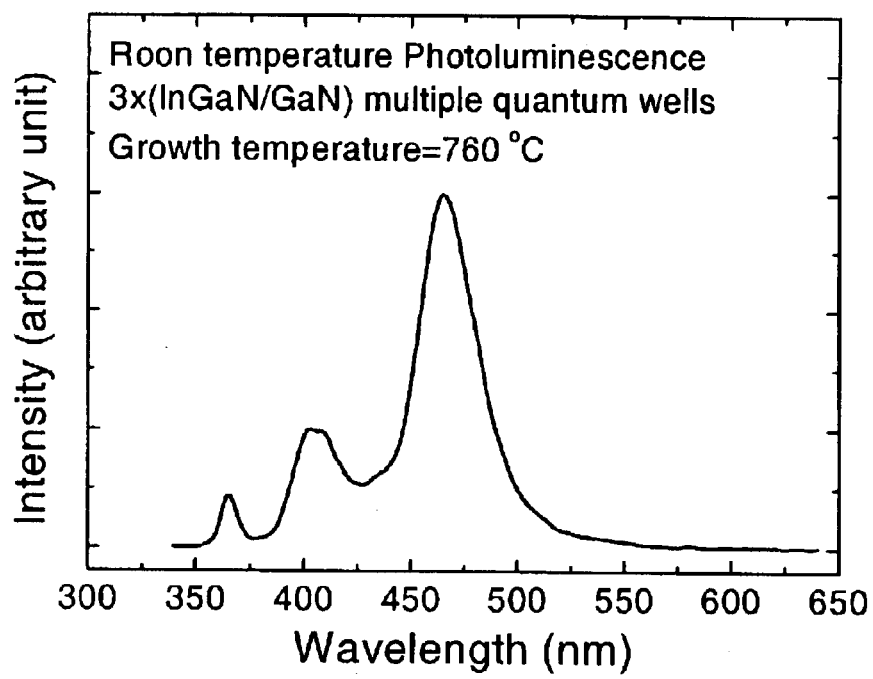
FIG. 6 is a graph showing the room-temperature optical characteristic spectrum of nanosized InGaN/GaN multiple quantum well nanograins embedded in the amorphous silicon nitride according to the present invention.

FIG. 5 shows the room-temperature optical characteristic spectra of InGaN nano grains embedded in the amorphous silicon nitride layer (base) 200 according to the present invention and FIG. 6 is a graph showing the room-temperature optical characteristic spectrum of nanosized InGaN/GaN multiple quantum well nanograins embedded in the amorphous silicon nitride matrix according to the present invention, in which the nanosized multiple quantum well nanograins are formed in such a manner that GaN nano grains are formed on the nitrided p-type silicon and then an InGaN layer with a thickness of 4 nm and a GaN layer with a thickness of 8 nm are alternately deposited on the GaN nano grains with a pair number of three at a growth temperature reduced to 760° C.

The nanosized multiple quantum well structure is composed of GaN having a large band gap and InGaN having a small band gap, which are alternately deposited, so as to increase the probability of capturing carriers in the InGaN layer by the quantum confinement effect, thereby improving the characteristics of the opto-electronic device. When the nano grains, obtained by alternately depositing the InGaN layer and GaN layer with a thickness of nanometer on the GaN nanograins with a size of nanometer, are embedded in the amorphous silicon nitride matrix 200, they can serve as essential active regions of the opto-electronic device.

More preferably, the method of fabricating the nitride semiconductor nanosized multiple quantum well light-emitting diode further includes a step S4 of repeatedly performing a process of growing nano grains of $Al_xIn_yGa_{1-x-y}N$ ($0 \leq x,y \leq 1$) or nanosized multiple quantum well nano grains 300 on the amorphous silicon nitride cover layer 220 and then forming the amorphous silicon cover layer 220 on the grown nano grains once or twenty times.

Figure 10:
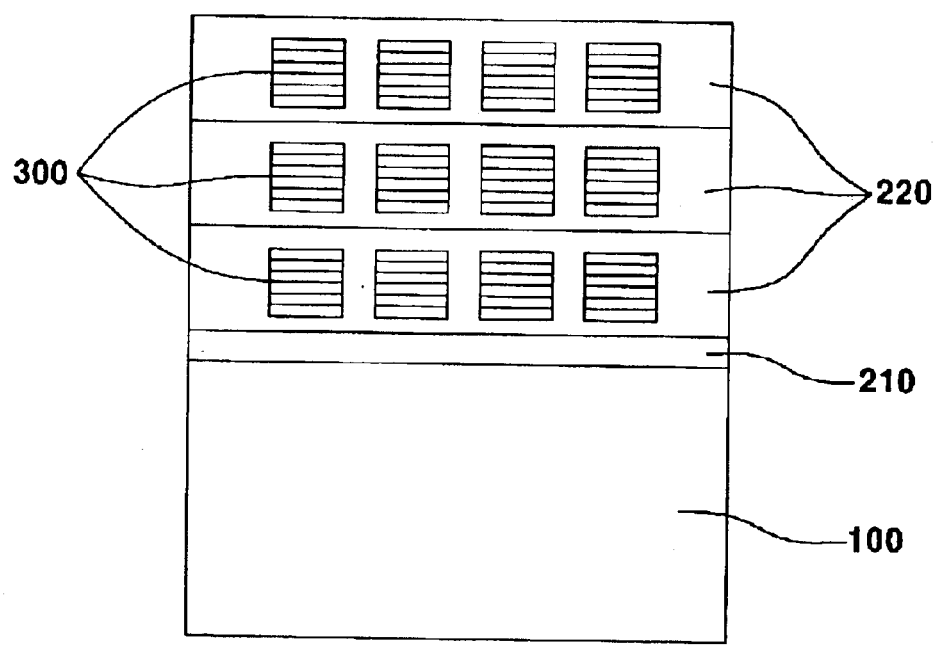
FIG. 10 is a schematic cross-sectional view showing the structure of a nanosized nitride semiconductor multiple quantum well light-emitting diode in which the amorphous silicon nitride cover layers having nanosized multiple quantum well nanograins are disposed on the amorphous silicon nitride cover layer in the form of a multi-layered structure according to the present invention.

FIG. 10 is a schematic cross-sectional view showing the structure of a nitride semiconductor nanosized multiple quantum well light-emitting diode in which the amorphous silicon nitride cover layers having nanosized multiple quantum well nanograins are disposed on the amorphous silicon nitride cover layer in the form of a multi-layered structure according to the present invention.

As shown in FIG. 10, the structure attained by repeatedly laminating the amorphous silicon nitride layer including the nitride semiconductor nano grains is constructed in such a manner that the amorphous silicon nitride layer 210 is formed on the silicon substrate 100 and the cover layer 220 covering the nitride semiconductor multiple quantum well nanograins 300 is repeatedly deposited on the amorphous silicon nitride layer 210.

Although injected electrons and holes are confined in the nanograins existing in a single layer of amorphous silicon nitride matrix to be recombined with each other to emit light, a part of the carriers, which are not confined, flows toward the opposite electrode. Thus, when the active layer including the nano grains is repeatedly stacked, the carriers that are not confined in the first active layer can be confined in the next active layer, resulting in the improvement of device performance.

Moreover, the size and composition of the nano grains in each active layer can be changed to emit white light by controlling the growth parameters. In addition to monochromatic light, lights with various wavelengths can be simultaneously emitted.

Figure 7:
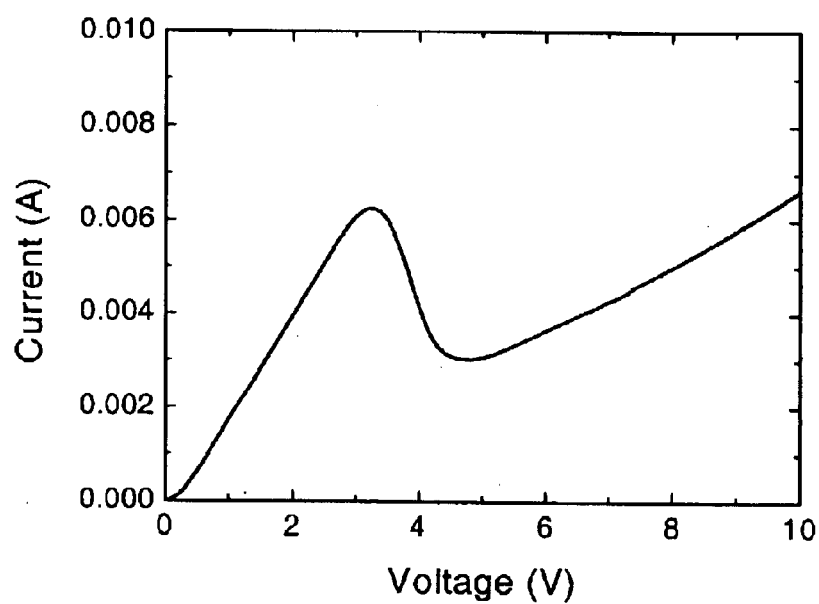
FIG. 7 is a graph showing the current-voltage characteristic of a resonant tunneling light-emitting diode composed of nanosized InGaN/GaN multiple quantum well nanocrystals embedded in an amorphous silicon nitride matrix according to the present invention.

FIG. 7 is a graph showing the current-voltage characteristic curve obtained by measuring the current-voltage characteristic of a device structure fabricated in a manner that a metal contact is formed on the top and bottom of the sample described in FIG. 6. The curve of FIG. 7 shows negative differential resistance characteristic in the forward bias region. This characteristic means that hole and electron carriers exhibit resonant tunneling phenomena when the device emits light.

The peak-to-valley current ratio was 2.1 at the room temperature. The performance of the resonant tunneling light-emitting diode (RTLED) using the multiple quantum well nanograins embedded in the amorphous silicon nitride layer (base) 200 can be improved when a highly doped $p^+$-silicon substrate 100, optimized multiple quantum well nanograins and a highly doped $n^+$-AlInGaN layer are used.

Figure 8:
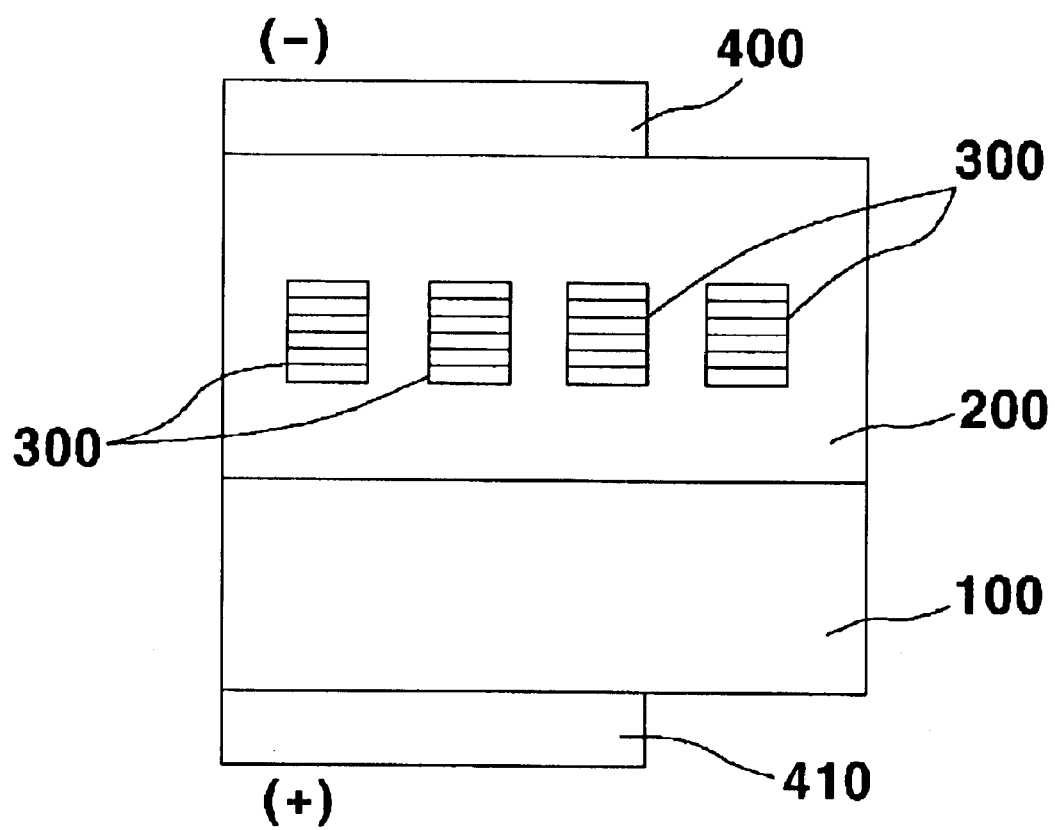
FIG. 8 is a schematic cross-sectional view showing the structure of the diode of FIG. 7.
Figure 9:
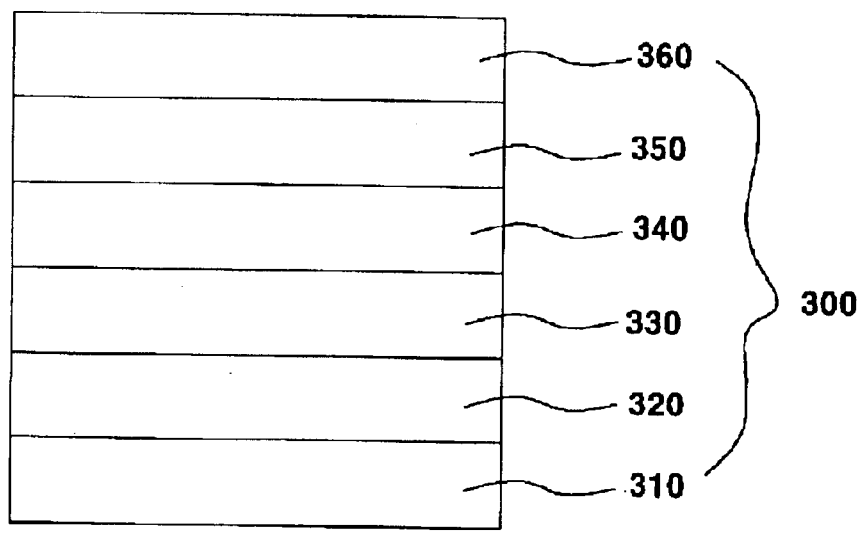
FIG. 9 is a schematic cross-sectional view showing the structure of one of the multiple quantum wells of FIG. 8.

FIG. 8 is a schematic cross-sectional view showing the structure of the diode of FIG. 7, and FIG. 9 is a schematic cross-sectional view showing the structure of one of the InGaN/GaN multiple quantum well nanograins 300 of FIG. 8.

As shown in FIG. 9, the multiple quantum well nanograins 300 are made in such a manner that an InGaN quantum well 310, a GaN quantum barrier 320, an InGaN 330, a GaN 340, an InGaN 350 and a GaN 360 are sequentially formed.

The structure of the nanosized multiple quantum well light-emitting diode proposed by the present invention can be used in various ways such as resonant tunneling diode, light-emitting diode, light detector and the like by partly changing the type of the substrate and the structure of metal contact. Furthermore, it is possible to fabricate a novel nanosize opto-electronic device, composed of a single multiple-quantum-well nanograin embedded in the amorphous silicon nitride layer (base) 200. Moreover, a novel nanosize light-emitting diode that does not require a p-type GaN thin film can be manufactured.

Preferred embodiments of the present invention will be described hereinafter in order to explain the present invention in more detail. However, the present invention is not limited to the following embodiments, and many alternatives, modifications, and variations will be apparent to those skilled in the art.

Embodiment 1

The p-type silicon substrate 100 was thermally nitrided using ammonia for 1 to 5 minutes at 900 to 1050° C. in a CVD apparatus, to form the thin amorphous silicon nitride layer 210 thereon, and then GaN nano grains 230 were grown on the thin amorphous silicon nitride layer for a predetermined period of time at various temperatures. The amorphous silicon nitride cover layer 220 having the thickness of approximately 20 nm was grown on the amorphous silicon nitride layer and the GaN nano grains using a CVD system. The size and density of crystal grains in nanometer size were controlled by changing growth parameters such as quantity of gallium source (1 to 1000 micromole/min), growth time (1 to 300 sec), growth temperature (500 to 1050° C.) and the like. The size of the nano grains was changed from several to hundreds nanometers.

Embodiment 2

The p-type silicon substrate 100 was nitrided using ammonia for 1 to 5 minutes at 900 to 1050° C. in a CVD apparatus, to form the thin amorphous silicon nitride layer 210 thereon, and then AlInGaN nano grains were grown on the thin amorphous silicon nitride layer for a predetermined period of time at various temperatures. The size and density of the AlInGaN nano grains were controlled by changing growth parameters such as quantities of gallium and aluminum sources (1 to 100 micromole/min), growth time (1 to 300 sec), quantity of indium source (1 to 500 micromole/min), growth temperature (500 to 800° C.) and the like. The flow rate of ammonia was 9100 standard cubic centimeter/min (sccm) when the AlInGaN nano grains was grown. The amorphous silicon nitride cover layer 220 having a thickness of about 20 nm was grown on the amorphous silicon nitride layer and the nitride nano grains using a CVD system.

Embodiment 3

The p-type silicon substrate 100 was nitrided using ammonia for 5 minutes at 900° C. in a CVD apparatus, to form the thin amorphous silicon nitride layer 210 thereon, and then GaN nanograins 230 were grown thereon for one minute at the same temperature. Then, the growth temperature is reduced to 700 to 800° C. and quantities of gallium and indium sources and ammonia gas were adjusted to grow InGaN nano grains on the GaN nano grains for a predetermined period of time. The amorphous silicon nitride cover layer 220 having a thickness of about 20 nm was grown on the amorphous silicon nitride layer 210 and the InGaN nanophase using a CVD system.

Embodiment 4

The p-type silicon substrate 100 was nitrided using ammonia for 5 minutes at 900° C. in a CVD apparatus to form the thin amorphous silicon nitride layer 210, and then GaN nano grains 230 were grown on the thin amorphous silicon nitride layer 210 for one minute at the same temperature. Then, the growth temperature was lowered to 700 to 800° C., and three to ten pairs of AlInGaN/AlInGaN multiple quantum well layers 300 were grown on the formed GaN nano grains. The amorphous silicon nitride cover layer 220 having a thickness of about 20 nm was grown on the amorphous silicon nitride layer and the multiple quantum wells using a CVD system.

Embodiment 5

Metal contact layers 400 and 410 having various structures were respectively formed on the top and bottom of each of the samples in various structures grown in the embodiment 4 using nickel, gold, titanium, aluminum, platinum, ruthenium or transparent metal oxide, for example, nickel oxide. As a result of measurement of the current-voltage characteristic, the characteristics of light-emitting diode, resonant tunneling diode and resonant tunneling light-emitting diode were obtained at constant temperature, depending on the various structures of metal contact.

Embodiment 6

N-type GaN or n-type AlInGaN was grown on the top of each of the samples having various structures, grown in the embodiment 4, and then the metal contact layers 400 and 410 of various structures were respectively formed on the top and bottom of the sample using titanium (Ti), aluminum (Al), gold (Au) or transparent metal oxides. As a measurement result of the current-voltage characteristic, the light-emitting diode characteristic was obtained at constant temperature.

The III-nitride compound semiconductor nanosized multiple quantum well light-emitting diode and the fabrication method thereof according to the present invention are free from the problems of the conventional III-nitride compound semiconductor epitaxial thin film growth on silicon substrates. Accordingly, a high-quality nitride semiconductor nanosized multiple quantum well light-emitting diode having no crystalline defect can be provided. Furthermore, the nanosized multiple quantum well light-emitting diode according to the present invention does not require a p-type GaN thin film so that there is no possibility of causing crack that is a problem in the conventional method of fabricating a III-nitride compound semiconductor multiple quantum well light-emitting diode using III-nitride epitaxial thin films grown on silicon substrates. In addition, the number of processes of fabricating the diode is remarkably reduced to result in an economical and productive opto-electronic device fabrication process. Moreover, the nanosized multiple quantum well light-emitting diode according to the present invention is fabricated using self-assembled high-quality GaN-based nanograins embedded in an amorphous silicon nitride matrix to enable the development of a novel functional opto-electronic device in nanometer size. This remarkably enlarges the applicable range of III-nitride compound semiconductor device.

The forgoing embodiments are merely exemplary and are not to be construed as limiting the present invention. The description of the present invention is intended to be illustrative, and not to limit the scope of the claims. Many alternatives, modifications, and variations will be apparent to those skilled in the art.

What is claimed is:

1. A method for fabricating a III-nitride compound semiconductor light-emitting diode using nanosize nitride semiconductor multiple quantum well nanograins embedded in an amorphous silicon nitride thin film matrix, comprising the steps of:

(a) forming an amorphous silicon nitride thin film with a thickness of 1 to 50 nm at a temperature of 25 to 1100° C. on a p-type silicon substrate;

(b) forming nanosize $Al_xIn_yGa_{1-x-y}N/Al_iIn_jGa_{1-i-j}N$ ($0 \leq x,y,i,j \leq 1$) multiple quantum well nanograins with a diameter of 3 to 500 nm at a growth temperature of 500 to 1100° C. by a chemical vapor deposition process or a molecular beam epitaxy process on the amorphous silicon nitride thin film, each AlInGaN layer having a thickness of 1 to 20 nm; and (c) forming an amorphous silicon nitride cover layer with a thickness of 1 to 50 nm which is formed on the multiple quantum well nanograins and the first amorphous silicon nitride thin film.

2. The method as claimed in claim 1, wherein the step (b) further comprises:

(d) growing $Al_xIn_yGa_{1-x-y}N$ ($0 \leq x,y \leq 1$) nanograins with a diameter of 1 to 300 nm at a temperature of 25 to 1100° C. on the amorphous silicon nitride thin film; and (e) growing nanometer-thick $Al_xIn_yGa_{1-x-y}N/Al_iIn_jGa_{1-i-j}N$ ($0 \leq x,y,i,j \leq 1$) multiple quantum well layers with a pair number of one to twenty on the $Al_xIn_yGa_{1-x-y}N$ nanograins.

3. The method as claimed in claim 1, further comprising a step of repeatedly performing, once to twenty times, a process of growing the multiple quantum well nanograins on the amorphous silicon nitride cover layer, and then growing an amorphous silicon nitride cover layer with a thickness of 1 to 20 nm.

4. The method as claimed in claim 1, further comprising a step of forming an n-type $Al_xIn_yGa_{1-x-y}N$ ($0 \leq x,y \leq 1$) electron injection layer with a thickness of 1 to 500 nm at a temperature of 500 to 1100° C. on the amorphous silicon nitride cover layer.

* * * * *